(12) United States Patent
Ikeda et al.

(10) Patent No.: US 11,302,880 B2
(45) Date of Patent: Apr. 12, 2022

(54) ORGANIC THIN-FILM TRANSISTORS AND METHODS FOR MANUFACTURING THE SAME AND IMAGE DISPLAY DEVICES

(71) Applicant: TOPPAN PRINTING CO., LTD., Taito-ku (JP)

(72) Inventors: Noriaki Ikeda, Taito-ku (JP); Makoto Nishizawa, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 108 days.

(21) Appl. No.: 16/283,666

(22) Filed: Feb. 22, 2019

(65) Prior Publication Data

US 2019/0189942 A1 Jun. 20, 2019

Related U.S. Application Data

(63) Continuation of application No. PCT/JP2017/029959, filed on Aug. 22, 2017.

(30) Foreign Application Priority Data

| Aug. 23, 2016 | (JP) | JP2016-162757 |
| Nov. 22, 2016 | (JP) | JP2016-227003 |
| Feb. 27, 2017 | (JP) | JP2017-035112 |

(51) Int. Cl.
*H01L 29/786* (2006.01)
*G09F 9/30* (2006.01)
(Continued)

(52) U.S. Cl.
CPC ............ *H01L 51/105* (2013.01); *G09F 9/30* (2013.01); *H01L 21/28* (2013.01);
(Continued)

(58) Field of Classification Search
CPC ............ H01L 27/3265; H01L 27/3274; H01L 51/0529; H01L 51/0545
See application file for complete search history.

(56) References Cited

U.S. PATENT DOCUMENTS

| 2008/0197348 A1* | 8/2008 | Matsubara ............ H01L 27/283 |
| | | 257/40 |
| 2010/0090205 A1* | 4/2010 | Ofuji ................... H01L 27/3265 |
| | | 257/40 |

(Continued)

FOREIGN PATENT DOCUMENTS

| JP | 2008-235861 | 10/2008 |
| JP | 2009-231325 | 10/2009 |

(Continued)

OTHER PUBLICATIONS

International Search Report dated Oct. 31, 2017, in corresponding Application No. PCT/JP2017/029959 filed on Aug. 22, 2017.

(Continued)

*Primary Examiner* — Raj R Gupta
(74) *Attorney, Agent, or Firm* — Oblon, McClelland, Maier & Neustadt, L.L.P.

(57) ABSTRACT

An organic thin-film transistor includes an insulating substrate, a capacitor electrode formed on the insulating substrate, a first insulating layer covering the capacitor electrode, a gate electrode formed on the first insulating layer, a second insulating layer covering the gate electrode and the capacitor electrode, a source electrode formed on the second insulating layer, a drain electrode formed on the second insulating layer, and a semiconductor layer formed on the (Continued)

second insulating layer in a portion between the source electrode and the drain electrode and including an organic semiconductor material.

26 Claims, 8 Drawing Sheets

(51) Int. Cl.
H01L 21/28 (2006.01)
H01L 29/417 (2006.01)
H01L 29/423 (2006.01)
H01L 29/49 (2006.01)
H01L 27/32 (2006.01)
H01L 51/10 (2006.01)
H01L 51/05 (2006.01)

(52) U.S. Cl.
CPC ...... H01L 27/3265 (2013.01); H01L 27/3274 (2013.01); H01L 29/417 (2013.01); H01L 29/423 (2013.01); H01L 29/49 (2013.01); H01L 29/786 (2013.01); H01L 51/0529 (2013.01); H01L 51/0541 (2013.01); H01L 51/0545 (2013.01)

(56) References Cited

U.S. PATENT DOCUMENTS

| | | | |
|---|---|---|---|
| 2011/0057918 | A1 | 3/2011 | Kimura et al. |
| 2014/0291614 | A1* | 10/2014 | Zou ..................... H01L 51/0529 257/20 |
| 2015/0243722 | A1 | 8/2015 | Kwon et al. |
| 2016/0012775 | A1 | 1/2016 | Jeong et al. |
| 2016/0141347 | A1 | 5/2016 | Kwon et al. |
| 2016/0321997 | A1 | 11/2016 | Jeong et al. |
| 2017/0222168 | A1 | 8/2017 | Ikeda |

FOREIGN PATENT DOCUMENTS

| | | |
|---|---|---|
| JP | 2015-142091 | 8/2015 |
| JP | 2016-066099 | 4/2016 |
| WO | 2016-067590 | 5/2016 |

OTHER PUBLICATIONS

T. Minari, et al., "Surface Selective Deposition of Molecular Semiconductors for Solution-Based integration of Organic field-effect Transistors", Applied Physics Letters, 94, 093307 (2009).

Extended European Search Report dated Jul. 31, 2019, in Patent Application No. 17843585.5, 8 pages

* cited by examiner

100

ORGANIC THIN-FILM TRANSISTORS AND METHODS FOR MANUFACTURING THE SAME AND IMAGE DISPLAY DEVICES

CROSS-REFERENCE TO RELATED APPLICATIONS

The present application is a continuation of International Application No. PCT/JP2017/029959, filed Aug. 22, 2017, which is based upon and claims the benefits of priority to Japanese Application No. 2016-162757, filed Aug. 23, 2016, Japanese Application No. 2016-227003, filed Nov. 22, 2016, and Japanese Application No. 2017-035112, filed Feb. 27, 2017. The entire contents of all of the above applications are incorporated herein by reference.

BACKGROUND OF THE INVENTION

Field of the Invention

The present invention relates to organic thin-film transistors and methods for producing the same, and image display devices.

Discussion of the Background

Thin-film transistors are widely used for active matrix display devices and sensors such as liquid crystal displays (LCD), organic electroluminescent (EL) displays, and electronic paper displays.

Semiconductor materials for use in the thin-film transistors mainly include those using amorphous silicon, polycrystalline silicon, or oxide semiconductors. In general, the thin-film transistors using these semiconductor materials are fabricated by dry coating methods such as vacuum deposition process and photolithography.

On the other hand, in recent years, organic thin-film transistors which use an organic material as a semiconductor material have been attracting attention (see PTL 1). In production of organic thin-film transistors, attempts have been made to use wet coating processes such as coating and printing not only for the semiconductor materials but also the conductive materials and insulating materials. As a result, the ability to produce flexible devices using a plastic substrate and reduce the cost is expected.

Further, since film formation and patterning are simultaneously performed in the printing process, material-use efficiency is improved compared with a vacuum deposition process which uses a conventional photolithography process. In addition, reduction in the environmental burden is expected, since development and etching processes are not necessary (see NPL 1).

PTL 1: JP 2015-142091 A

NPL 1: T. Minari, M. Kano, T. Miyadera, S. D. Wang, Y. Aoyagi, and K. Tsukagoshi, "Surface selective deposition of molecular semiconductors for solution-based integration of organic field-effect transistors". Applied Physics Letters, 94, 093307 (2009)

SUMMARY OF THE INVENTION

According to an aspect of the present invention, an organic thin-film transistor includes an insulating substrate, a capacitor electrode formed on the insulating substrate, a first insulating layer covering the capacitor electrode, a gate electrode formed on the first insulating layer, a second insulating layer covering the gate electrode and the capacitor electrode, a source electrode formed on the second insulating layer, a drain electrode formed on the second insulating layer, and a semiconductor layer formed on the second insulating layer in a portion between the source electrode and the drain electrode and including an organic semiconductor material.

According to another aspect of the present invention, an organic thin-film transistor includes an insulating substrate, a capacitor electrode formed on the insulating substrate, a first insulating layer covering the capacitor electrode, a gate electrode formed on the first insulating layer, a second insulating layer covering the gate electrode and not covering the capacitor electrode, a source electrode formed on the second insulating layer, a drain electrode formed on the second insulating layer, and a semiconductor layer formed on the second insulating layer in a portion between the source electrode and the drain electrode and including an organic semiconductor material.

According to still another aspect of the present invention, an organic thin-film transistor includes an insulating substrate, a gate electrode formed on the insulating substrate, a capacitor electrode, an insulating layer including a first insulating layer and a second insulating layer, a source electrode, a drain electrode, and a semiconductor layer including an organic semiconductor material. The first insulating layer covers the insulating substrate and the gate electrode, and the second insulating layer covers the capacitor electrode formed on the first insulating layer.

According to yet another aspect of the present invention, an organic thin-film transistor includes an insulating substrate, a first capacitor electrode formed on the insulating substrate, a first insulating layer formed on the first capacitor electrode, a source electrode formed on the first insulating layer, a drain electrode formed on the first insulating layer such that the drain electrode overlaps with at least a portion of the first capacitor electrode in a plan view, a semiconductor layer formed on the first insulating layer and including an organic semiconductor material, a second insulating layer formed on the source electrode, at least a portion of the drain electrode, and the semiconductor layer, and a gate electrode formed on the second insulating layer.

According to yet another aspect of the present invention, a method for producing an organic thin-film transistor includes forming a first capacitor electrode on an insulating substrate, forming a first insulating layer on the first capacitor electrode, forming a source electrode and a drain electrode spaced from each other on the first insulating layer, forming a semiconductor layer including an organic semiconductor material between the source electrode and the drain electrode, forming a second insulating layer on the semiconductor layer, and forming a gate electrode on the second insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
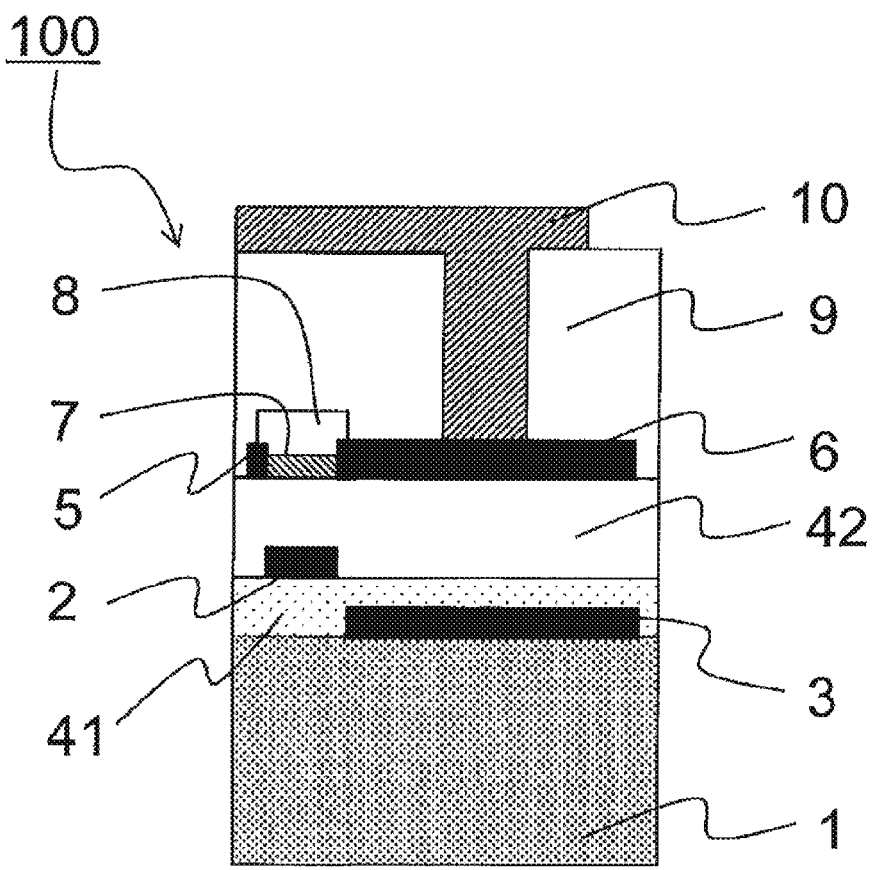
FIG. 1 is a schematic cross-sectional view of an organic thin-film transistor according to a first embodiment of the present invention.

With reference to the drawings, embodiments of the present invention will now be described. Throughout the embodiments, the same or corresponding components are denoted by the same reference characters, and the duplicated description thereof may be omitted.

First Embodiment

Figure 4:
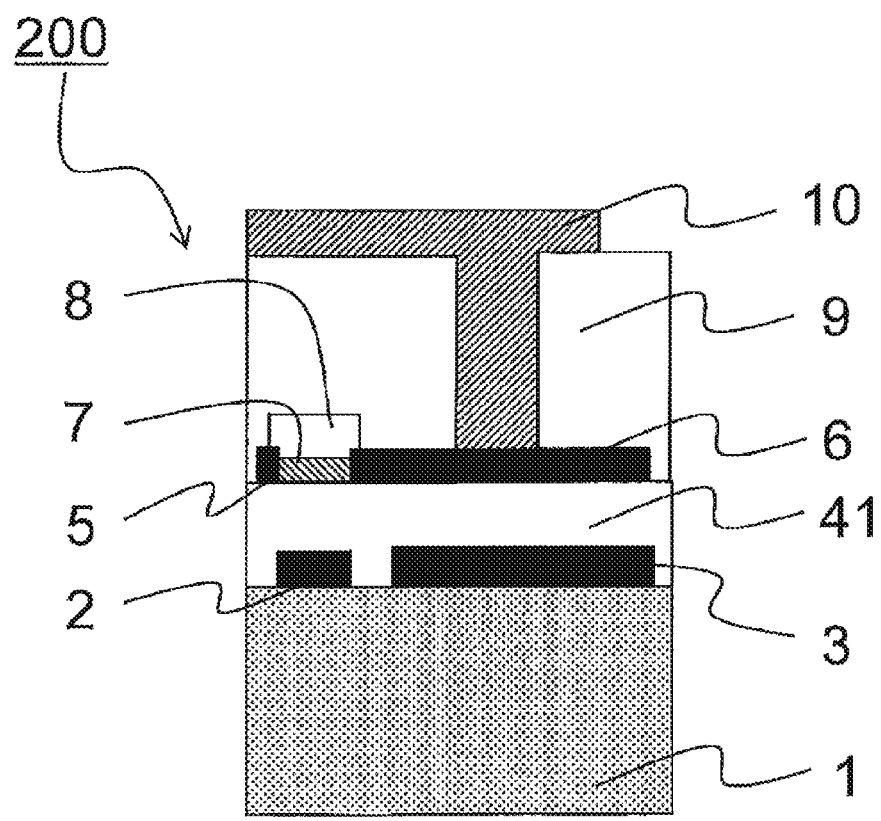
FIG. 4 is a schematic cross-sectional view of an organic thin-film transistor according to the conventional art.

FIG. 1 is a schematic cross-sectional view of an organic thin-film transistor 100 according to a first embodiment of the present invention. Further, FIG. 4 is a schematic cross-sectional view of an organic thin-film transistor 200 according to the conventional art.

The organic thin-film transistor 100 includes a capacitor electrode 3 formed on an insulating substrate 1, a first insulating layer 41 formed to cover at least the capacitor electrode 3, a gate electrode 2 formed on the first insulating layer 41, a second insulating layer 42 formed to cover at least the gate electrode 2 and the capacitor electrode 3, a source electrode 5 formed on the second insulating layer 42, a drain electrode 6, and a semiconductor layer 7 including an organic semiconductor material. Further, a protective layer 8 for protecting the semiconductor layer 7 is also favorably used.

On the other hand, the organic thin-film transistor 200 includes the gate electrode 2 and the capacitor electrode 3 formed on the insulating substrate 1, the first insulating layer 41 formed to cover at least the gate electrode 2 and the capacitor electrode 3, the source electrode 5 formed on the first insulating layer 41, the drain electrode 6, and the semiconductor layer 7 including an organic semiconductor material.

Further, the organic thin-film transistor 100 and the organic thin-film transistor 200 may include an inter-layer insulating film 9, a pixel electrode 10, a display element (not shown), a counter electrode (not shown), and a second substrate (not shown) to thereby provide an image display device. The structure of the counter electrode and the second substrate may be changed as appropriate according to the type of the display element used.

In the following description, components of the organic thin-film transistor 100 will be described in connection with manufacturing steps of the organic thin-film transistor 100.

First, the substrate 1 is provided. The layer under the substrate 1 may have any structure. Materials for the substrate 1 include, but are not limited to, polycarbonate, polyethylene sulfide, polyethersulfone, polyethylene terephthalate, polyethylene naphthalate, cycloolefin polymer, triacetylcellulose, polyvinyl fluoride film, ethylene-tetrafluoroethylene copolymer resin, weather-resistant polyethylene terephthalate, weather-resistant polypropylene, glass fiber reinforced acryl resin film, glass fiber reinforced polycarbonate, polyimide, or fluororesins, cyclic polyolefin resin, glass, and quartz glass. They may be used singly or in combination of two or more as the composite substrate 1.

Then, the capacitor electrode 3 is formed on the substrate 1. There is no need to explicitly distinguish the electrode portion and the wiring portion in the gate electrode 2, the capacitor electrode 3, the source electrode 5, and the drain electrode 6. These are referred to as electrode as components of the organic thin-film transistor.

Then, the first insulating layer 41 is formed to cover the capacitor electrode 3. Further, the gate electrode 2 is formed on the first insulating layer 41. Further, the second insulating layer 42 is formed to cover the gate electrode 2. In so doing, the second insulating layer 42 is formed to cover the capacitor electrode 3 via the first insulating layer 41.

Materials for the gate electrode 2 and the capacitor electrode 3 include, but are not limited to, metal materials such as aluminum (Al), copper (Cu), molybdenum (Mo), silver (Ag), chromium (Cr), titanium (Ti), gold (Au), platinum (Pt), tungsten (W) and manganese (Mn), and conductive metal oxide materials such as indium oxide (InO), tin oxide (SnO), zinc oxide (ZnO), indium tin oxide (ITO) and indium zinc oxide (IZO). These materials may be used as a single layer or as a laminate or alloy thereof.

The gate electrode 2 and the capacitor electrode 3 can be fabricated by a vacuum deposition process such as vacuum vapor deposition or sputtering, or a sol-gel process using precursors or the like of a conductive material or a process using nanoparticles, or a method using these materials as ink to form a film by wet coating such as screen printing, relief printing, or ink jetting. However, the methods are not limited thereto, and any method known in the art can be used. Patterning can be performed, for example, by photolithography by which a region to be patterned is masked with a resist and then etching by which unnecessary regions are removed, or by direct patterning such as a printing method. However, the methods are not limited thereto, and any method known in the art can be used.

Materials for the first insulating layer 41 and the second insulating layer 42 include, but are not limited to, oxide-based insulative materials such as silicon oxide (SiOx), aluminum oxide (AlOx), tantalum oxide (TaOx), yttrium oxide (YOx), zirconium oxide (ZrOx) and hafnium oxide (HfOx), silicon nitride (SiNx), silicon oxynitride (SiON), polyacrylates such as polymethylmethacrylate (PMMA), organic insulative materials such as polyvinyl alcohol (PVA) and polyvinyl phenol (PVP), and self-assembled monolayers. These may be used as a single layer or a laminate of two or more layers, or as an inorganic-organic hybrid thin film, or with graded compositions in a growth direction.

When a self-assembled monolayer is used for the first insulating layer 41 and the second insulating layer 42, different self-assembled materials can be laminated as a multi-layered film structure to thereby control dielectric constant and insulation properties of the insulating layer.

Further, the self-assembled multi-layer films can be repeatedly laminated to further improve insulation properties. Moreover, surface functional groups can be selected depending on the type of the semiconductor layer 7 formed on the surface of the second insulating layer 42 to control a surface energy to thereby improve performance of the organic thin-film transistor 100.

The first insulating layer 41 and the second insulating layer 42 can be fabricated by a vacuum deposition process such as vacuum vapor deposition or sputtering, or a sol-gel process using metal complexes or the like as precursors or a process using nanoparticles, or a wet coating method such as slit coating, spin coating, screen printing, relief printing, or ink jetting. However, the methods are not limited thereto, and any method known in the art can be used.

The first insulating layer 41 and the second insulating layer 42 may use the same material and composition, or may use different materials. That is, in the embodiment of the present invention, a suitable material can be selectively used according to the properties required for each layer. Further, the structure may be, but is not limited to, monolayer, multilayer, or various combinations thereof.

In the organic thin-film transistor 100, the capacitor electrode 3 and the drain electrode 6 are insulated by the insulating layer therebetween (first insulating layer 41 and second insulating layer 42) to thereby form a capacitor structure.

The second insulating layer 42, which is formed between the semiconductor layer 7 and the gate electrode 2, has a direct effect on channel formation. On the other hand, the first insulating layer 41, which is formed as a layer under the gate electrode 2, has a small effect on the channels. Accordingly, the first insulating layer 41 and the second insulating layer 42 can be selected in consideration of capacitor capacitance and transistor characteristics, respectively.

Electrostatic capacitance can be increased by using a material for the first insulating layer 41 having a relative dielectric constant higher than that of the second insulating layer 42. The relative dielectric constant of the second insulating layer 42 is preferably in the range of 2 or more and 5 or less. Further, the relative dielectric constant of the first insulating layer 41 is preferably 3 or more, preferably 5 or more, and more preferably 20 or more, but is not limited thereto.

The area of the capacitor electrode 3 is preferably large considering the effect thereof. If the capacitor electrode 3 is formed in the same layer as the gate electrode 2, short circuit between the gate electrode 2 and the capacitor electrode 3 is more likely to occur with an increase in the area of the capacitor electrode. Accordingly, a sufficient space is necessary between the gate electrode 2 and the capacitor electrode 3. In the embodiment of the present invention, however, the insulating layer (first insulating layer 41) is provided between the gate electrode 2 and the capacitor electrode 3. Accordingly, occurrence of short circuit between the gate electrode 2 and the capacitor electrode 3 can be prevented.

In the organic thin-film transistor 200 according to the conventional art, electrostatic capacitance of the capacitor can be increased with a decrease in thickness of the insulating layer (first insulating layer 41) between the capacitor electrode 3 and the drain electrode 6. Meanwhile, considering transistor characteristics and pressure resistance, the insulating layer needs to have at least a certain degree of film thickness, which is often larger than the film thickness appropriate for the electrostatic capacitance of the capacitor.

Figure 2:
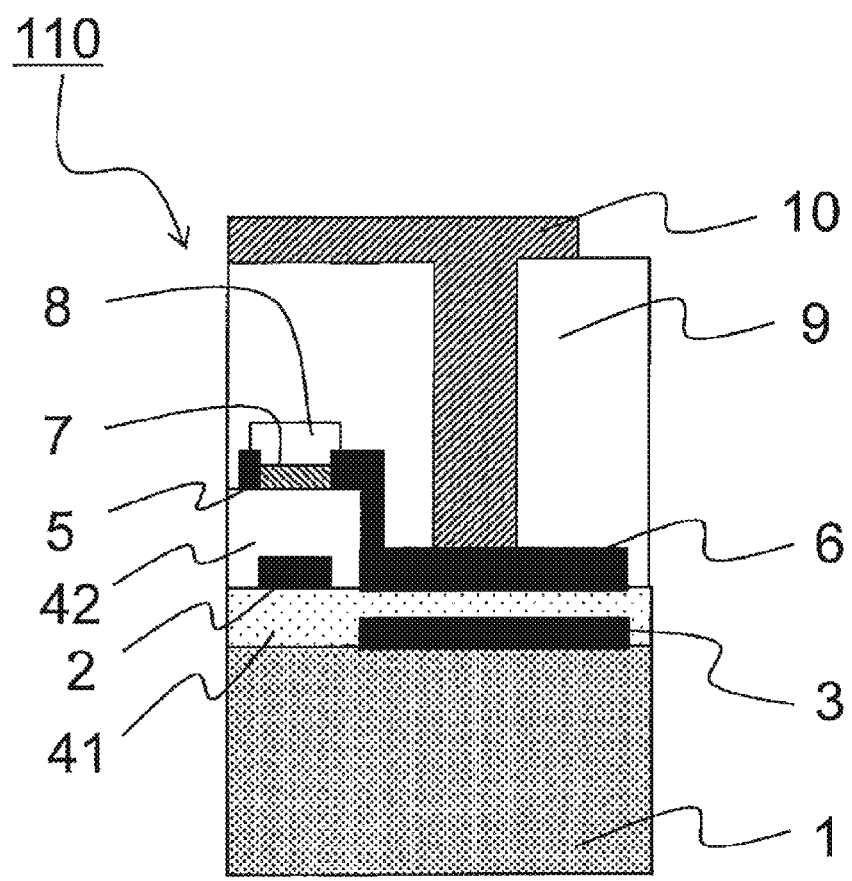
FIG. 2 is a schematic cross-sectional view of a modified example of the organic thin-film transistor according to the first embodiment of the present invention.

One of measures to be taken in this case is to provide an organic thin-film transistor 110 according to a modified example of the organic thin-film transistor 100. FIG. 2 shows a schematic cross-sectional view of the organic thin-film transistor 110.

In the organic thin-film transistor 110, only the first insulating layer 41 is formed between the capacitor electrode 3 and the drain electrode 6 since the second insulating layer 42 is not formed on the upper side of the capacitor electrode 3. Accordingly, materials and film thicknesses of the first insulating layer 41 and the second insulating layer 42 can be independently determined in consideration of transistor characteristics and electrostatic capacitance of the capacitor, respectively.

On the other hand, since the organic thin-film transistor 110 is required to have high positional precision of the second insulating layer 42 compared with the organic thin-film transistor 100, it is desired to selectively determine the appropriate structure according to the intended transistor characteristics and the electrostatic capacitance of the capacitor.

Figure 3:
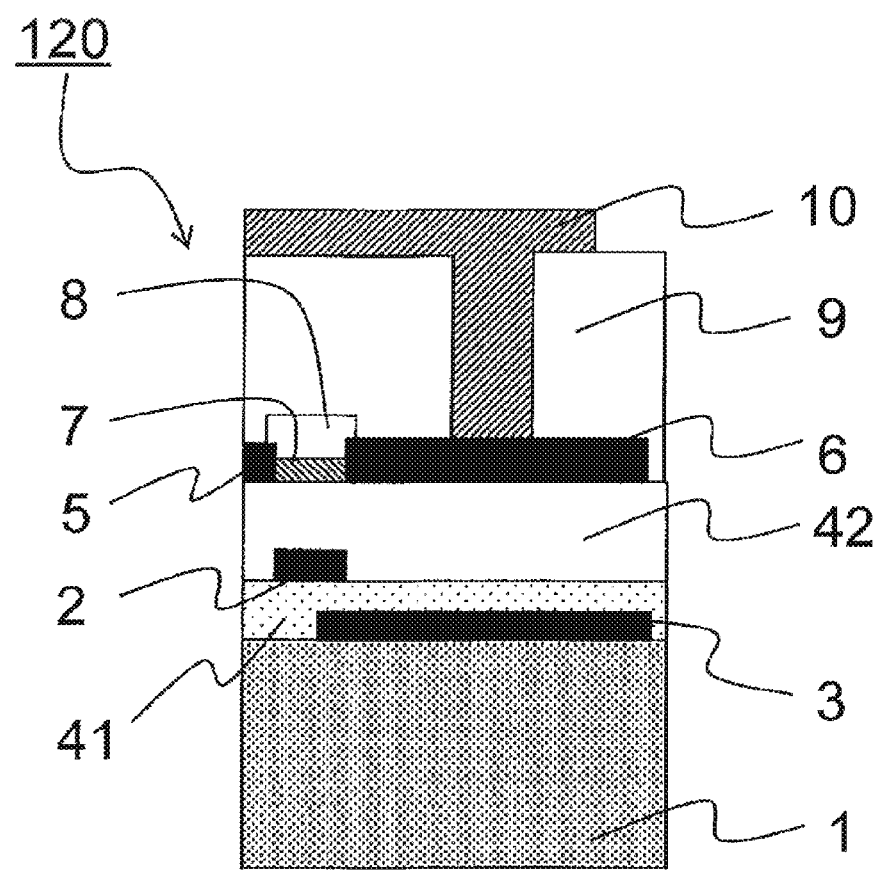
FIG. 3 is a schematic cross-sectional view of a modified example of the organic thin-film transistor according to the first embodiment of the present invention.

Further, the positional precision of the gate electrode 2 and the capacitor electrode 3 largely depends on the precision in the fabrication process. When the capacitor electrode having an increased area is fabricated by a method with low patterning precision such as a wet coating method, there is a high probability that the gate electrode 2 and the capacitor electrode 3 partially overlap with each other via the first insulating layer 41 when viewed in a lamination direction from the substrate 1 toward the semiconductor layer 7. Such an organic thin-film transistor 120 is shown in FIG. 3. However, even in such a case, there is no particular problem as long as transistor characteristics required for the display performance are sufficiently obtained.

Then, the source electrode 5 and the drain electrode 6 are formed on the gate electrode 2 via the second insulating layer 42. The source electrode 5 and the drain electrode 6 can be fabricated by the same materials and methods described above for the gate electrode 2 and the capacitor electrode 3.

The source electrode 5 and the drain electrode 6 may be a bottom contact structure, in which the source electrode 5 and the drain electrode 6 are fabricated before the semiconductor layer 7, or a top contact structure, in which the source electrode 5 and the drain electrode 6 are fabricated after the semiconductor layer 7.

Further, when the bottom contact structure is used, a surface-treatment or the like can be applied to the source electrode 5 and the drain electrode 6 in order to reduce contact resistance in electrical connection to the semiconductor layer 7.

Then, the semiconductor layer 7 is formed on the second insulating layer 42, the source electrode 5, and the drain electrode 6. Materials for the semiconductor layer 7 include, but are not limited to, small molecular semiconductor materials such as pentacene and derivatives thereof, and macromolecular organic semiconductor materials such as polythiophene, polyallylamine, fluorene-bithiophene copolymer, and derivatives thereof.

The semiconductor layer 7 can be fabricated by a wet coating method such as relief printing, screen printing, ink jetting, or nozzle printing in which a solution of dissolved or dispersed organic semiconductor material is used as ink. However, the methods are not limited thereto, and any method known in the art can be used.

The organic thin-film transistor 100 can be favorably provided with the protective layer 8 so as to protect the semiconductor layer 7 from external influences. If provided, the protective layer 8 is preferably disposed to cover at least the channel region of the semiconductor layer 7.

Materials for the protective layer 8 include, but are not limited to, inorganic materials such as silicon oxide, aluminum oxide, tantalum oxide, yttrium oxide, hafnium oxide, hafnium aluminate, zirconium oxide and titanium oxide, or insulating materials such as polyacrylates such as PMMA (polymethylmethacrylate), or PVA (polyvinyl alcohol), PVP (polyvinylphenol) or fluororesins.

When used in an image display device, the organic thin-film transistor 100 favorably includes the inter-layer insulating film 9, the pixel electrode 10, a display element (not shown), a counter electrode (not shown), and a counter substrate (not shown).

The inter-layer insulating film 9 is provided mainly to insulate the source electrode 5 from the pixel electrode 10 to thereby prevent source-drain leakage via the pixel electrode 10.

Materials for the inter-layer insulating film 9 include, but are not limited to, inorganic materials such as silicon oxide, aluminum oxide, tantalum oxide, yttrium oxide, hafnium oxide, hafnium aluminate, zirconium oxide and titanium oxide, or insulating materials such as polyacrylates such as PMMA (polymethylmethacrylate), or PVA (polyvinyl alcohol), PVP (polyvinylphenol) or fluororesins.

The pixel electrode 10 is provided to improve the aperture ratio of the image display device. Further, an opaque material can be used to prevent the semiconductor layer 7 from being irradiated with light from outside.

Materials for the pixel electrode 10 include, but are not limited to, metal materials such as aluminum (Al), copper (Cu), molybdenum (Mo), silver (Ag), chromium (Cr), titanium (Ti), gold (Au), platinum (Pt), tungsten (W) and manganese (Mn), and conductive metal oxide materials such as indium oxide (InO), tin oxide (SnO), zinc oxide (ZnO), indium tin oxide (ITO) and indium zinc oxide (IZO). These materials may be used as a single layer or as a laminate or alloy thereof.

The display element may be liquid crystals, electrophoretic particles, or microcapsules containing electrophoretic particles, or organic electroluminescent elements. The image display device is not limited to either a reflective type or a transparent type, and may use these generally known display elements. Further, depending on the display element used, a plurality of organic thin-film transistors 100 may be provided in a single pixel.

The image display device can be provided by forming the display element on a counter substrate having a counter electrode, followed by bonding the counter substrate to the organic thin-film transistor 100 in which the pixel electrode 10 and elements thereunder are formed, or by forming the display element on the pixel electrode 10, followed by laminating the counter electrode and the counter substrate on the pixel electrode 10. The process of forming the image display device can be appropriately selected according to the display element used.

Second Embodiment

Figure 5:
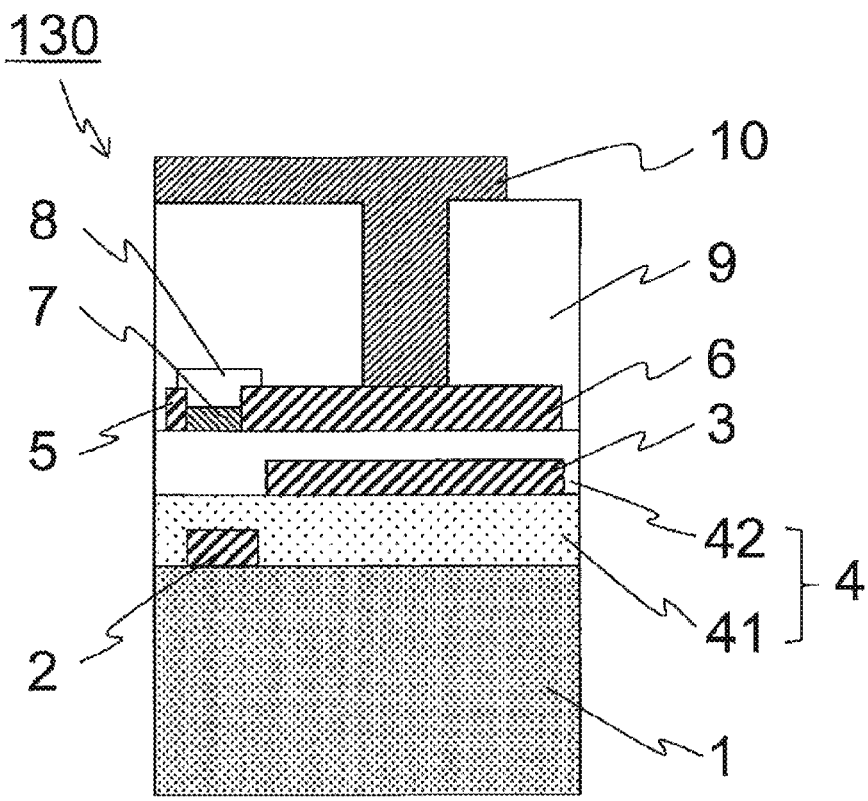
FIG. 5 is a schematic cross-sectional view of an organic thin-film transistor according to a second embodiment of the present invention.
Figure 8:
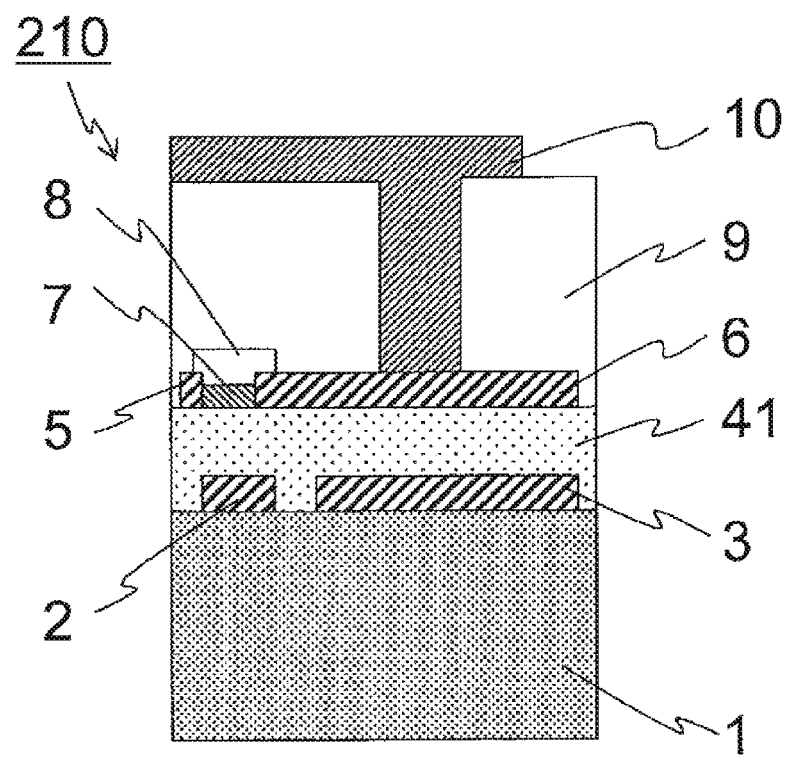
FIG. 8 is a schematic cross-sectional view of an organic thin-film transistor according to the conventional art.

FIG. 5 is a schematic cross-sectional view of an organic thin-film transistor 130 according to a second embodiment of the present invention. Further, FIG. 8 is a schematic cross-sectional view of an organic thin-film transistor 210 according to the conventional art.

The organic thin-film transistor 130 includes a gate electrode 2 formed on an insulating substrate 1, a first insulating layer 41 formed to cover at least the gate electrode 2, a capacitor electrode 3 formed on the first insulating layer 41, a second insulating layer 42 formed to cover at least the gate electrode 2 and the capacitor electrode 3 in plan view, a source electrode 5 formed on the second insulating layer 42, a drain electrode 6, and a semiconductor layer 7 made of an organic semiconductor material. Further, a protective layer 8 for protecting the semiconductor layer 7 is also favorably used.

On the other hand, the organic thin-film transistor 210 includes the gate electrode 2 and the capacitor electrode 3 formed on the insulating substrate 1, the first insulating layer 41 formed to cover at least the gate electrode 2 and the capacitor electrode 3, the source electrode 5 and the drain electrode 6 formed on the first insulating layer 41, and the semiconductor layer 7 made of an organic semiconductor material.

Further, the organic thin-film transistor 130 and the organic thin-film transistor 210 may include an inter-layer insulating film 9, a pixel electrode 10, a display element (not shown), a counter electrode (not shown), and a second substrate (not shown) to thereby provide an image display device. The structure of the counter electrode and the second substrate may be changed as appropriate according to the type of the display element used.

In the following description, components of the organic thin-film transistor 130 wilt be described in connection with manufacturing steps of the organic thin-film transistor 130.

First, the substrate 1 is provided. The layer under the substrate 1 may have any structure. Materials for the substrate 1 include, but are not limited to, polycarbonate, polyethylene sulfide, polyethersulfone, polyethylene terephthalate, polyethylene naphthalate, cycloolefin polymer, triacetylcellulose, polyvinyl fluoride film, ethylene-tetrafluoroethylene copolymer resin, weather-resistant polyethylene terephthalate, weather-resistant polypropylene, glass fiber reinforced acryl resin film, glass fiber reinforced polycarbonate, polyimide, or fluororesins, cyclic polyolefin resin, glass, and quartz glass. They may be used singly or in combination of two or more as the composite substrate 1.

Then, the gate electrode 2 is formed on the substrate 1. There is no need to explicitly distinguish the electrode portion and the wiring portion in the gate electrode 2, the capacitor electrode 3, the source electrode 5, and the drain electrode 6. These are referred to as electrodes as components of the organic thin-film transistor.

Further, the First insulating layer 41 is formed to cover the gate electrode 2. Further, the capacitor electrode 3 is formed on the first insulating layer 41. Then, the second insulating layer 42 is formed to cover the capacitor electrode 3. In so doing, the second insulating layer 42 is formed to cover the gate electrode 2 via the first insulating layer 41 in plan view.

Materials for the gate electrode and the capacitor electrode 3 include, but are not limited to, metal materials such as aluminum (Al), copper (Cu), molybdenum (Mo), silver (Ag), chromium (Cr), titanium (Ti), gold (Au), platinum (Pt), tungsten (W) and manganese (Mn), and conductive metal oxide materials such as indium oxide (InO), tin oxide (SnO), zinc oxide (ZnO), indium tin oxide (ITO) and indium zinc oxide (IZO). These materials may be used as a single layer or as a laminate or alloy thereof.

The gate electrode 2 and the capacitor electrode 3 can be fabricated by a vacuum deposition process such as vacuum vapor deposition or sputtering, or a sol-gel process using precursors or the like of a conductive material or a process using nanoparticles, or a method using these materials as ink to form a film by wet coating such as screen printing, relief printing, or ink jetting. However, the methods are not limited thereto, and any method known in the art can be used. Patterning can be performed, for example, by photolithography by which a region to be patterned is masked with a resist and then etching by which unnecessary regions are removed, or by direct patterning such as a printing method. However, the methods are not limited thereto, and any method known in the art can be used.

Materials for the first insulating layer 41 and the second insulating layer 42 include, but are not limited to, oxide-based insulative materials such as silicon oxide (SiOx), aluminum oxide (AlOx), tantalum oxide (TaOx), yttrium oxide (YOx), zirconium oxide (ZrOx) and hafnium oxide (HfOx), silicon nitride (SiNx), silicon oxynitride (SiON), polyacrylates such as polymethylmethacrylate (PMMA), organic insulative materials such as polyvinyl alcohol (PVA) and polyvinyl phenol (PVP), and self-assembled monolayers. These may be used as a single layer or a laminate of two or more layers, or as an inorganic-organic hybrid thin film, or with graded compositions in a growth direction.

When a self-assembled monolayer is used for the first insulating layer 41 and the second insulating layer 42, different self-assembled materials can be laminated as a multi-layered film structure to thereby control dielectric constant and insulation properties of the insulating layer. Further, the self-assembled multi-layer films can be repeatedly laminated to further improve insulation properties. Moreover, surface functional groups can be selected depending on the type of the semiconductor layer 7 formed on the surface of the second insulating layer 42 to control the surface energy to thereby improve performance of the organic thin-film transistor 130.

The first insulating layer 41 and the second insulating layer 42 can be fabricated by a vacuum deposition process such as vacuum vapor deposition or sputtering, or a sol-gel process using metal complexes or the like as precursors or a process using nanoparticles, or a wet coating method such as slit coating, spin coating, screen printing, relief printing, or ink jetting. However, the methods are not limited thereto, and any method known in the art can be used.

The first insulating layer 41 and the second insulating layer 42 may use the same material and composition, or may appropriately use materials suitable for the characteristics required for the respective layers. Further, the structure may be, but is not limited to, monolayer, multilayer, or various combinations thereof.

The area of the capacitor electrode 3 is preferably large considering the effect thereof. If the capacitor electrode 3 is formed in the same layer as the gate electrode 2, short circuit between the gate electrode 2 and the capacitor electrode 3 is more likely to occur with an increase in the area of the capacitor electrode. Accordingly, a sufficient space is necessary between the gate electrode 2 and the capacitor electrode 3. In the embodiment of the present invention, however, the insulating layer (first insulating layer 41) is provided between the gate electrode 2 and the capacitor electrode 3. Accordingly, occurrence of short circuit between the gate electrode 2 and the capacitor electrode 3 can be prevented.

In the organic thin-film transistor 130, the capacitor electrode 3 and the drain electrode 6 are insulated by the insulating layer therebetween (second insulating layer 42) to thereby form a capacitor structure. Accordingly, electrostatic capacitance can be increased by using a material having a high relative dielectric constant for the second insulating layer 42. The relative dielectric constant of the second insulating layer 42 is preferably 3 or more, preferably 5 or more, and more preferably 20 or more, but is not limited thereto.

On the other hand, a material having too high a relative dielectric constant is in general not suitable for use as the insulating layer between the gate electrode and the semiconductor layer in consideration of transistor characteristics. The relative dielectric constant of the insulating layer between the gate electrode 2 and the semiconductor layer 7 is preferably in the range of 2 or more and 5 or less. In the embodiment of the present invention, the insulating layer 4 which is a laminate of the first insulating layer 41 and the second insulating layer 42 is disposed between the gate electrode 2 and the semiconductor layer 7. Accordingly, using a material having extremely high relative dielectric constant for the second insulating layer 42 only for the purpose of increasing electrostatic capacitance of the capacitor results in a decrease in transistor characteristics.

The electrostatic capacitance of the capacitor can be increased by decreasing a thickness of the second insulating layer 42. Further, the effect of the first insulating layer 41 can be dominant in the insulating layer between the gate electrode and the semiconductor layer by decreasing a thickness of the second insulating layer 42 relative to the first insulating layer 41 to thereby facilitate control of transistor characteristics. However, it is still difficult to completely eliminate effects of the second insulating layer 42 on the transistor characteristics.

Figure 6:
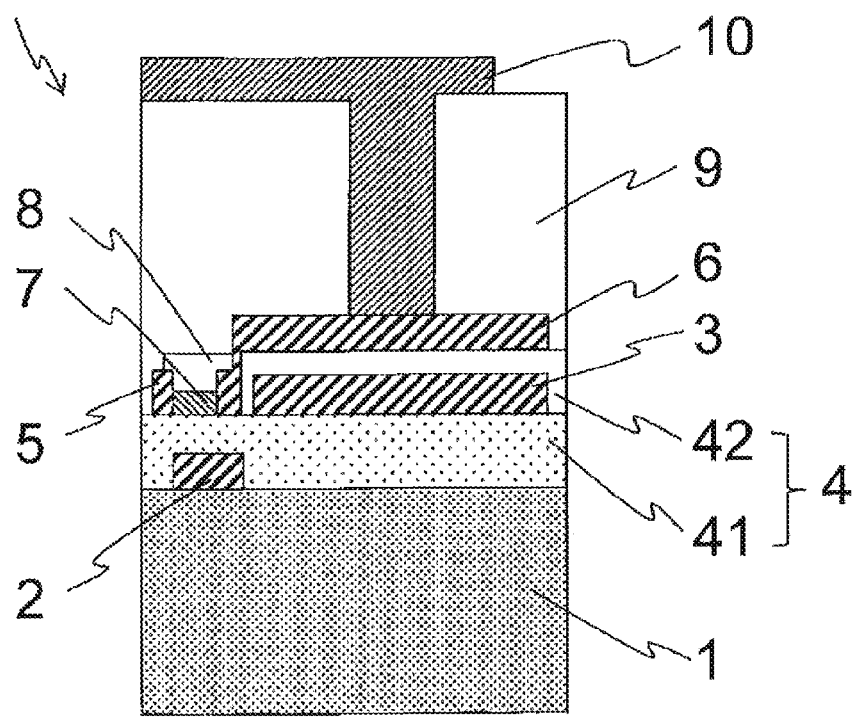
FIG. 6 is a schematic cross-sectional view of a modified example of the organic thin-film transistor according to the second embodiment of the present invention.

FIG. 6 shows a schematic cross-sectional view of an organic thin-film transistor 140 according to a modified example of the organic thin-film transistor 130, which implements measures to be taken for this case.

In the organic thin-film transistor 140, only the first insulating layer 41 is formed between the gate electrode 2 and the semiconductor layer 7 since the second insulating layer 42 is not formed on the upper side of the gate electrode 2. Accordingly, the first insulating layer 41 and the second insulating layer 42 can be independently determined in consideration of transistor characteristics and electrostatic capacitance of the capacitor, respectively.

On the other hand, since the organic thin-film transistor 140 is required to have high patterning precision of the second insulating layer 42 compared with the organic thin-film transistor 130, it is desired to selectively determine the appropriate structure according to the intended transistor characteristics and the electrostatic capacitance of the capacitor.

Figure 7:
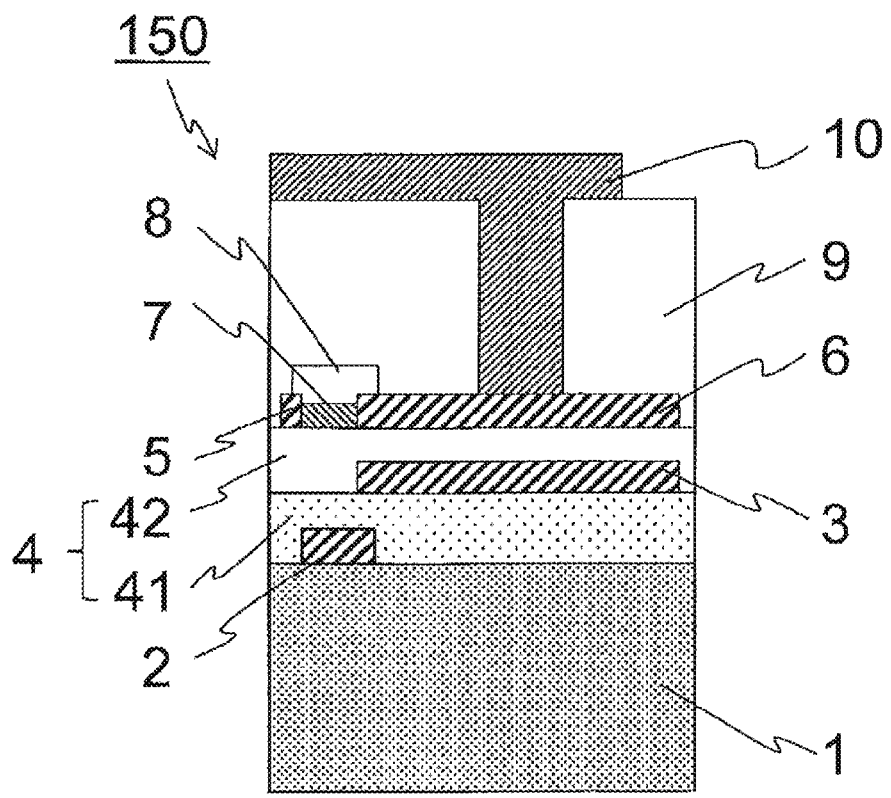
FIG. 7 is a schematic cross-sectional view of a modified example of the organic thin-film transistor according to the second embodiment of the present invention.

The positional precision of the gate electrode 2 and the capacitor electrode 3 largely depends on the precision in fabrication process. When the capacitor electrode 3 having an increased area is fabricated by a method with low patterning precision such as a wet coating method, there is a high probability that the gate electrode 2 and the capacitor electrode 3 partially overlap with each other via the first insulating layer 41 in the horizontal cross-sectional direction when viewed in a lamination direction from the substrate 1 toward the semiconductor layer 7. Such an organic thin-film transistor 150 is shown in FIG. 7. However, even in such a case, there is no particular problem as long as transistor characteristics required for the display performance are sufficiently obtained.

Then, the source electrode 5 and the drain electrode are formed on the gate electrode 2 via the second insulating layer 42. The source electrode 5 and the drain electrode 6 can be fabricated by the same materials and methods described above for the gate electrode 2 and the capacitor electrode 3.

The source electrode 5 and the drain electrode 6 may be a bottom contact structure, in which the source electrode 5 and the drain electrode 6 are fabricated before the semiconductor layer 7, or a lop contact structure, in which the source electrode 5 and the drain electrode 6 are fabricated after the semiconductor layer 7.

When the bottom contact structure is used, in some cases, good characteristics can be obtained by applying a surface-treatment or the like to the source electrode 5 and the drain electrode 6 to thereby reduce contact resistance in electrical connection to the semiconductor layer 7.

Then, the semiconductor layer 7 is formed on the second insulating layer 42, the source electrode 5, and the drain electrode 6. Materials for the semiconductor layer 7 include, but are not limited to, small molecular semiconductor materials such as pentacene and derivatives thereof, and macromolecular organic semiconductor materials such as polythiophene, polyallylamine, fluorene-bithiophene copolymer, and derivatives thereof.

The semiconductor layer 7 can be fabricated by a wet coating method such as relief printing, screen printing, ink jetting, or nozzle printing in which a solution of dissolved or dispersed organic semiconductor material is used as ink. However, the methods are not limited thereto, and any method known in the art can be used.

In some cases, improved transistor characteristics can be obtained by applying a surface-treatment or the like to the interface between the semiconductor layer 7 and the second insulating layer 42.

The organic thin-film transistor 130 can be favorably provided with the protective layer 8 so as to protect the semiconductor layer 7 from external influence. If provided, the protective layer 8 is preferably disposed to cover at least the channel region of the semiconductor layer 7.

Materials for the protective layer 8 include, but are not limited to, inorganic materials such as silicon oxide, aluminum oxide, tantalum oxide, yttrium oxide, hafnium oxide, hafnium aluminate, zirconium oxide and titanium oxide, or insulating materials such as polyacrylates such as PMMA (polymethylmethacrylate), or PVA (polyvinyl alcohol), PVP (polyvinylphenol) or fluororesins.

When used in an image display device, the organic thin-film transistors 130 and 140 favorably include the inter-layer insulating film 9, the pixel electrode 10, a display element (not shown), a counter electrode (not shown), and a counter substrate (not shown).

The inter-layer insulating film 9 is provided mainly to insulate the source electrode 5 from the pixel electrode 10 to thereby prevent source-drain leakage via the pixel electrode 10.

Materials for the inter-layer insulating film 9 include, but are not limited to, inorganic materials such as silicon oxide, aluminum oxide, tantalum oxide, yttrium oxide, hafnium oxide, hafnium aluminate, zirconium oxide and titanium oxide, or insulating materials such as polyacrylates such as PMMA (polymethylmethacrylate), or PVA (polyvinyl alcohol), PVP (polyvinyl phenol) or fluororesins.

The pixel electrode 10 is provided to improve aperture ratio of the image display device. Further, an opaque material can be used for the pixel electrode 10 to prevent the semiconductor layer 7 from being irradiated with light from outside.

Materials for the pixel electrode 10 include, but are not limited to, metal materials such as aluminum (Al), copper (Cu), molybdenum (Mo), silver (Ag), chromium (Cr), titanium (Ti), gold (Au), platinum (Pt), tungsten (W) and manganese (Mn), and conductive metal oxide materials such as indium oxide (InO), tin oxide (SnO), zinc oxide (ZnO), indium tin oxide (ITO) and indium zinc oxide (IZO). These materials may be used as a single layer or as a laminate or alloy thereof.

The display element may be liquid crystals, electrophoretic particles, or microcapsules containing electrophoretic particles, or organic electroluminescent elements. The image display device is not limited to either a reflective type or a transparent type, and may use these generally known display elements. Further, depending on the display element used, a plurality of organic thin-film transistors 130 and 140 may be provided in a single pixel.

The image display device can be provided by forming the display element on a counter substrate having a counter electrode, followed by bonding the counter substrate to the organic thin-film transistors 130 and 140 in which the pixel electrode 10 and elements thereunder are formed, or by forming the display element on the pixel electrode 10, followed by laminating the counter electrode and the counter substrate on the pixel electrode 10. The process of forming the image display device can be appropriately selected according to the display element used.

Third Embodiment

Figure 9:
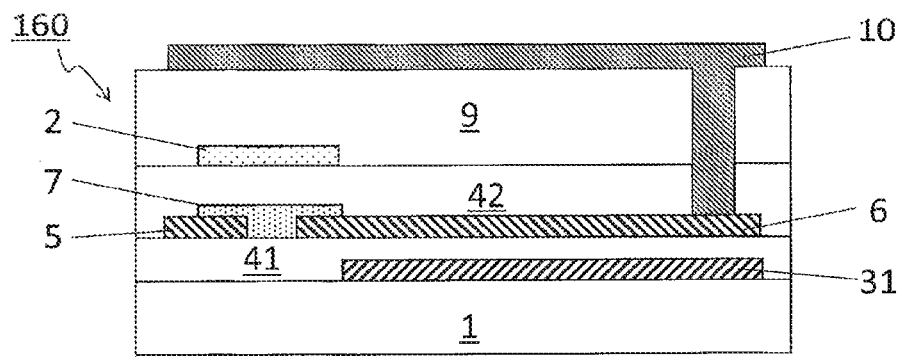
FIG. 9 is a schematic cross-sectional view of an organic thin-film transistor according to a third embodiment of the present invention.
Figure 10:
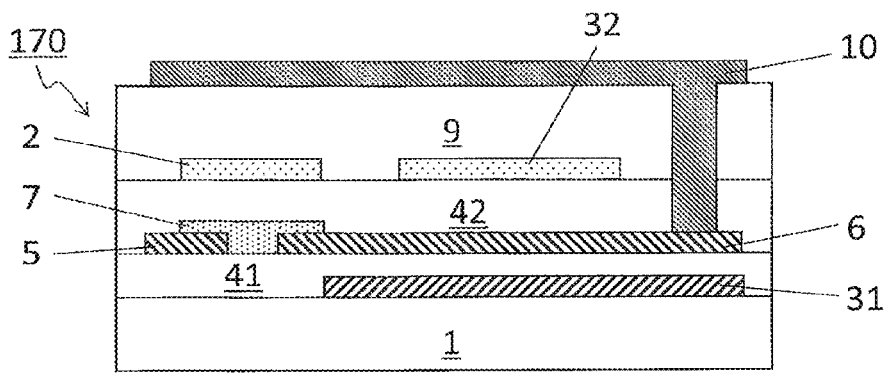
FIG. 10 is a schematic cross-sectional view of a modified example of the organic thin-film transistor according to the third embodiment of the present invention.

FIG. 9 is a schematic cross-sectional view of an organic thin-film transistor 160 according to a third embodiment of the present invention, and FIG. 10 is a schematic cross-sectional view of an organic thin-film transistor 170 according to a modified example of the organic thin-film transistor 160.

The organic thin-film transistor 160 includes at least a first capacitor electrode 31 formed on the insulating substrate 1, the first insulating layer 4 the source electrode 5, the drain electrode 6, and the semiconductor layer 7 including an organic semiconductor material, the second insulating layer 42, and the gate electrode 2. Further, the organic thin-film transistor 170 includes at least a second capacitor electrode 32 in addition to the components included in the organic thin-film transistor 160.

As shown in FIG. 9, in the organic thin-film transistor 160, the first capacitor electrode 31 is formed on the substrate 1; the first insulating layer 41 is formed on the substrate 1 and on the first capacitor electrode 31; the source electrode 5, the drain electrode 6, and the semiconductor layer 7 are formed on the first insulating layer 41; the second insulating layer 42 is formed on the source electrode 5, at least part of the drain electrode 6, and the semiconductor layer 7; and the gate electrode 2 is formed on the second insulating layer 42. The drain electrode 6 overlaps with at least part of the first capacitor electrode 31 in plan view.

As shown in FIG. 10, in the organic thin-film transistor 170, the second capacitor electrode 32 is further formed on the second insulating layer 42, and the second capacitor electrode 32 overlaps with at least part of the drain electrode 6 in plan view.

The organic thin-film transistor 160 and the organic thin-film transistor 170 are different from each other whether it has the second capacitor electrode 32 or not. As shown in FIG. 10, providing the second capacitor electrode 32 enables increase of the electrostatic capacitance generated in the drain electrode 6.

Further, the organic thin-film transistor 160 and the organic thin-film transistor 170 may include an inter-layer insulating film 9, a pixel electrode 10, a display element (not shown), a counter electrode (not shown), and a second substrate (not shown) to thereby provide an image display device. The structure of the counter electrode and the second substrate may be changed as appropriate according to the type of the display element used.

In the following description, components of the organic thin-film transistor 160 and the organic thin-film transistor 170 will be described in connection with manufacturing steps of the organic thin-film transistor 160 and the organic thin-film transistor 170.

First, the substrate 1 is provided. Materials for the substrate 1 include, but are not limited to, polycarbonate, polyethylene sulfide, polyethersulfone, polyethylene terephthalate, polyethylene naphthalate, cycloolefin polymer, triacetylcellulose, polyvinyl fluoride film, ethylene-tetrafluoroethylene copolymer resin, weather-resistant polyethylene terephthalate, weather-resistant polypropylene, glass fiber reinforced acryl resin film, glass fiber reinforced polycarbonate, polyimide, or fluororesins, cyclic polyolefin resin, glass, and quartz glass. They may be used singly or in combination of two or more as the composite substrate 1.

When the substrate 1 is an organic film, a transparent gas barrier layer (not shown) may also be formed in order to improve durability of the organic thin-film transistors 160 and 170. Materials for the gas barrier layer include, but are not limited thereto, aluminum oxide ($Al_2O_3$), silicon oxide (SiO), silicon nitride (SiN), silicon oxynitride (SiON), silicon carbide (SiC), and diamond-like carbon (DLC). Further, these gas barrier layers can be used as a laminate of two or more layers. The gas barrier layer may be formed on either or both surfaces of the substrate 1 made of an organic film. The gas barrier layer can be formed by methods such as vacuum vapor deposition, ion plating, sputtering, laser ablation, plasma CVD (chemical vapor deposition), hot wire CVD, and a sol-gel method. However, the present invention is not limited thereto.

Further, an adhesive layer can be provided, or a surface treatment can be applied to the surface of the substrate 1 so that the first capacitor electrode 31 and the first insulating layer 41, which are formed in contact with the substrate 1, are more strongly adhered to the substrate 1.

Then, the first capacitor electrode 31 is formed on the substrate 1. There is no need to explicitly distinguish the electrode portion and the wiring portion in the first capacitor electrode 31, the source electrode 5, the drain electrode 6, the gate electrode 2, and the second capacitor electrode 32. These are referred to as electrodes as components of the organic thin-film transistors 160 and 170.

Materials for the first capacitor electrode 31 include, but are not limited to, metal materials such as aluminum (Al), copper (Cu), molybdenum (Mo), silver (Ag), chromium (Cr), titanium (Ti), gold (Au), platinum (Pt), tungsten (W), manganese (Mn), niobium (Nb), and tantalum (Ta), and conductive metal oxide materials such as indium oxide (InO), tin oxide (SnO), zinc oxide (ZnO), indium tin oxide (ITO) and indium zinc oxide (IZO). These materials may be used as a single layer or as a laminate or alloy thereof.

The first capacitor electrode 31 can be fabricated by a vacuum deposition process such as vacuum vapor deposition or sputtering, or a sol-gel process using precursors or the like of a conductive material or a process using nanoparticles, or a method using these materials as ink to form a film by wet coating method such as screen printing, relief printing, or ink jetting. However, the methods are not limited thereto, and any method known in the art can be used. Patterning can be performed, for example, by photolithography by which a region to be patterned is masked with a resist and then etching by which unnecessary regions are removed, or by direct patterning such as a printing method. However, the methods are not limited thereto, and any method known in the art can be used.

Then, the first insulating layer 41 is formed on the first capacitor electrode 31. The first insulating layer 41 is provided at least on the first capacitor electrode 31 to electrically insulate the first capacitor electrode 31 from electrodes such as the source electrode 5, the drain electrode 6, and the gate electrode 2, but may also be provided on the entire surface of the substrate 1 except for a wiring portion used for connection of the first capacitor electrode 31 to external and other electrodes.

Materials for the first insulating layer 41 include, but are not limited to, oxide-based insulative materials such as silicon oxide (SiOx), aluminum oxide (AlOx) tantalum oxide (TaOx), yttrium oxide (YOx), zirconium oxide (ZrOx) and hafnium oxide (HfOx), silicon nitride (SiNx), silicon oxynitride (SiON), polyacrylates such as polymethylmethacrylate (PMMA), and organic insulative materials such as polyvinyl alcohol (PVA) and polyvinyl phenol (PVP). These may be used as a single layer or a laminate of two or more layers, or as an inorganic-organic hybrid thin film, or with graded compositions in a growth direction.

The first insulating layer 41 preferably has a resistivity of not less than $10^{11}$ Ωcm, and more preferably not less than $10^{14}$ Ωcm in order to reduce a leakage current of the organic thin-film transistors 160 and 170.

The first insulating layer 41 is disposed between the first capacitor electrode 31 and the drain electrode 6 for the purpose of generating capacitance in a region in which the first capacitor electrode 31 overlaps with the drain electrode 6 in plan view. Accordingly, the first insulating layer 41 preferably has a large relative dielectric constant. The relative dielectric constant is 3.0 or more, preferably 5 or more, and more preferably 20 or more, but is not limited thereto. Further, the first insulating layer 41 preferably has a thin film thickness, which can be adjusted as appropriate taking into consideration the insulation properties of the first insulating layer 41, reliability of the organic thin-film transistors 160 and 170, difficulty in the manufacturing process, and the like. The film thickness of the first insulating layer 41 is preferably thinner than that of the second insulating layer 42.

Then, the source electrode 5 and the drain electrode 6 are fabricated. The source electrode 5 and the drain electrode 6 are formed spaced from each other. The source electrode 5 and the drain electrode 6 can be fabricated by different processes and different materials. However, if they are disposed in the same layer above the first insulating layer 41, the source electrode 5 and the drain electrode 6 are preferably formed at the same time.

The source electrode 5 and the drain electrode 6 can use conductive materials which are the same as the first capacitor electrode 31. These materials can be used as a laminate or alloy.

The source electrode 5 and the drain electrode 6 can be fabricated by a vacuum, deposition process such as vacuum vapor deposition or sputtering, or a sol-gel process using precursors or the like of a conductive material or a process using nanoparticles, or a method using these materials as ink to form a film by wet coating method such as screen printing, relief printing, or ink jetting. However, the methods are not limited thereto, and any method known in the art can be used. Patterning can be performed, for example, by photolithography by which a region to be masked is masked with a resist and then etching by which unnecessary regions are removed, or by direct patterning such as a printing method.

However, the methods are not limited thereto, and any method known in the art can be used.

The source electrode 5 and the drain electrode 6 may be a bottom contact structure, in which the source electrode 5 and the drain electrode 6 are fabricated before the semiconductor layer 7, or a top contact structure, in which the source electrode 5 and the drain electrode 6 are fabricated after the semiconductor layer 7.

Further, when the bottom contact structure is used, a surface-treatment or the like can be applied to the source electrode 5 and the drain electrode 6 in order to reduce contact resistance in electrical connection to the semiconductor layer 7. Specifically, a molecular film such as a self-assembled monolayer (SAM) can be formed on the surface of the source electrode 5 and the drain electrode 6 to thereby modify a work function of the electrode surface.

Then, the semiconductor layer 7 is fabricated between the source electrode 5 and the drain electrode 6 so as to connect the source electrode 5 and the drain electrode 6 to each other. It is typical that the source electrode 5 and the drain electrode 6 are connected to each other via the semiconductor layer 7, and the region of the semiconductor layer 7 serving as a thin-film transistor is called a channel region. This term may also be used.

Materials for the semiconductor layer 7 include, but are not limited to, small molecular semiconductor materials such as pentacene and derivatives thereof, and macromolecular organic semiconductor materials such as polythiophene, polyallylamine, fluorene-bithiophene copolymer, and derivatives thereof.

The semiconductor layer 7 can be fabricated by a wet coating method such as relief printing, screen printing, ink jetting, or nozzle printing in which a solution of dissolved or dispersed organic semiconductor material is used as ink. Alternatively, it also can be fabricated by methods such as vacuum vapor deposition using powders or crystal of organic semiconductor materials. The methods for fabricating the semiconductor layer 7 are not limited to these, and any method known in the art can be used.

Then, the second insulating layer 42 is formed to cover at least the channel region of the semiconductor layer 7. In order to ensure insulation between the respective electrodes in the organic thin-film transistors 160 and 170, the second insulating layer 42 may also be formed, in addition to being formed on the channel region, on the entire surface of the substrate except for the source electrode 5 and its wiring and a connecting section on electrodes such as the drain electrode 6 to external and other electrodes, and the region for forming the second insulating layer 42 can be adjusted as appropriate.

Materials for the second insulating layer 42 include, but are not limited to, oxide-based insulative materials such as silicon oxide (SiOx), aluminum oxide (AlOx), tantalum oxide (TaOx), yttrium oxide (YOx), zirconium oxide (ZrOx) and hafnium oxide (HfOx), silicon nitride (SiNx), silicon oxynitride (SiON), polyacrylates such as polymethylmethacrylate (PMMA), and organic insulative materials such as polyvinyl alcohol (PVA) and polyvinyl phenol (PVP). These may be used as a single layer or a laminate of two or more layers, or as an inorganic-organic hybrid thin film, or with graded compositions in a growth direction.

The second insulating layer 42 preferably has a resistivity of not less than $10^{11}$ Ωcm, and more preferably not less than $10^{14}$ Ωcm in order to reduce a leakage current of the organic thin-film transistors 160 and 170.

The second insulating layer 42 can be fabricated by a vacuum deposition process such as vacuum vapor deposition or sputtering, or a sol-gel process using metal complexes or the like as precursors or a process using nanoparticles, or a wet coating method such as slit coating, spin coating, screen printing, relief printing, or ink jetting. However, the methods are not limited thereto, and any method known in the art can be used.

Then, the gate electrode 2 is formed on the second insulating layer 42 in a region overlapping with at least the channel region in plan view. The gate electrode 2 can be fabricated by the same materials and methods described above for the source electrode 5 and the drain electrode 6.

Further, as shown in FIG. 10, the capacitor capacitance of the organic thin-film transistor can be increased by providing the second capacitor electrode 32 on the second insulating layer 42 in a region overlapping with the drain electrode 6 in plan view.

The second capacitor electrode 32 can be fabricated by the same materials and methods described above for the source electrode 5 and the drain electrode 6.

The second capacitor electrode 32 can be formed in the same layer as the gate electrode 2, and made using the same material and the same process, or made of different materials, without being limited to those described above.

When used in an image display device, the organic thin-film transistor 160 and the organic thin-film transistor 170 favorably include the inter-layer insulating film 9, the pixel electrode 10, a display element (not shown), a counter electrode (not shown), and a counter substrate (not shown).

The inter-layer insulating film 9 is provided mainly to insulate the gate electrode 2 and the second capacitor electrode 32 from the pixel electrode 10 to thereby prevent source-drain leakage via the pixel electrode 10.

Materials for the inter-layer insulating film 9 include, but are not limited to, inorganic materials such as silicon oxide, aluminum oxide, tantalum oxide, yttrium oxide, hafnium oxide, hafnium aluminate, zirconium oxide and titanium oxide, or insulating materials such as polyacrylates such as PMMA (polymethylmethacrylate), or PVA (polyvinyl alcohol), PVP (polyvinylphenol) or fluororesins.

The material of the inter-layer insulating film 9 preferably has a resistivity of not less than $10^{11}$ Ωcm, and more preferably not less than $10^{14}$ Ωcm in order to reduce a leakage current of the thin-film transistor.

The inter-layer insulating film 9 is formed by a method such as ink jetting, relief printing, planographic printing, intaglio printing, or screen printing, by using a solution in which a protective layer material or precursors thereof are dissolved or dispersed. These inter-layer insulating films 9 may be used as a single layer or as a laminate of two or more layers. Further, compositions can be graded in a growth direction.

The pixel electrode 10 is provided to improve aperture ratio of the image display device.

Materials for the pixel electrode 10 include, but are not limited to, metal materials such as aluminum (Al), copper (Cu), molybdenum (Mo), silver (Ag), chromium (Cr), titanium (Ti), gold (Au), platinum (Pt), tungsten (W) and manganese (Mn), and conductive metal oxide materials such as indium oxide (InO), tin oxide (SnO), zinc oxide (ZnO), indium tin oxide (ITO) and indium zinc oxide (IZO). These materials may be used as a single layer or as a laminate or alloy thereof.

The pixel electrode 10 can be fabricated by a vacuum deposition process such as vacuum vapor deposition or sputtering, or a sol-gel process using precursors or the like of a conductive material or a process using nanoparticles, or a method using these materials as ink to form a film by wet coating method such as screen printing, relief printing, or ink jetting. However, the methods are not limited thereto, and any method known in the art can be used. Patterning can be performed, for example, by photolithography by which a region to be patterned is masked with a resist and then etching by which unnecessary regions are removed, or by direct patterning such as a printing method. However, the methods are not limited thereto, and any method known in the art can be used.

Further, an opaque material can be used for the pixel electrode 10 to prevent the semiconductor layer 7 from being irradiated with light front outside.

The display element may be liquid crystals, electrophoretic particles, or microcapsules containing electrophoretic particles, or organic electroluminescent elements. The image display device is not limited to either a reflective type or a transparent type, and may use these generally known display elements. Further, depending on the display element used, a plurality of organic thin-film transistors 160 and 170 may be provided in a single pixel.

The image display device can be provided by forming the display element on a counter substrate having a counter electrode, followed by bonding the counter substrate to the organic thin-film transistors 160 and 170 in which the pixel electrode 10 is formed, or by forming the display element on the pixel electrode 10, followed by laminating the counter electrode and the counter substrate on the pixel electrode 10. The process of forming the image display device can be appropriately selected according to the display element used.

EXAMPLES

Example 1

In Example 1, the organic thin-film transistor 100 shown in FIG. 1 was prepared.

An alkali-free glass of 0.7 mm thickness was used as the substrate 1. Silver nano ink, which is a dispersion solution of silver nanoparticles, was applied to the glass substrate 1 in a desired pattern by using an ink jet method, followed by baking at 150° C. for one hour to thereby form the capacitor electrode 3. The capacitor electrode 3 had an area of 75% relative to the area of the element.

On the substrate 1 on which the capacitor electrode 3 was formed, a photosensitive acryl resin was applied by a slit coating method. Then, light exposure and development were performed to pattern a desired shape, followed by baking at 200° C. to thereby form the first insulating layer 41.

On the substrate 1 on which the first insulating layer 41 was formed, silver nano ink was applied in a desired pattern by using an ink jet method, followed by baking at 150° C. for one hour to thereby form the gate electrode 2. A minimum space between the gate electrode and the capacitor electrode in a horizontal cross-sectional direction was 0 µm.

Then, the second insulating layer 42 was formed in the same manner as that of the first insulating layer 41. The film thickness of the first insulating layer 41 was 0.2 µm, and the film thickness of the second insulating layer 42 was 1.0 µm. The relative dielectric constant of the photosensitive acryl resin was 3.4.

A dispersion solution of silver nanoparticles was applied as ink in a desired pattern by using an ink jet method, followed by baking at 150° C. for one hour to thereby form the source electrode 5 and the drain electrode 6.

Then, a mesitylene solution in which poly(3-hexylthiophene) was dissolved at a concentration of 0.1 wt. % was patterned as an organic semiconductor material by an ink jet method to thereby form the semiconductor layer 7.

Comparative Example 1

In Comparative Example 1, the organic thin-film transistor 200 shown in FIG. 4 was fabricated.

An alkali-free glass of 0.7 mm thickness was used as the substrate 1. On the glass substrate 1, a Mo film was formed at 400 nm thickness by using DC magnetron sputtering, and patterned in a desired shape by photolithography to thereby form the gate electrode 2 and the capacitor electrode 3. A minimum space between the gate electrode and the capacitor electrode in a horizontal cross-sectional direction was 20 µm. The capacitor electrode had an area of 60% relative to the area of the element.

On the substrate 1 on which the gate electrode 2 and the capacitor electrode 3 were formed, a photosensitive acryl resin was applied by a slit coating method, and patterned by photolithography, followed by baking at 200° C. to thereby form only the first insulating layer 41 on the gate electrode 2 and the capacitor electrode 3. The film thickness of the first insulating layer 41 was 1 µm, and the relative dielectric constant was 3.4.

Subsequently, ink in which silver nanoparticles were dispersed was applied in a desired pattern by using an ink jet method, followed by baking at 150° C. for one hour to thereby form the some electrode 5 and the drain electrode 6.

Then, a mesitylene solution in which poly(3-hexylthiophene) was dissolved at a concentration of 0.1 wt. % was patterned as an organic semiconductor material by an ink jet method to thereby form the semiconductor layer 7.

Thus, the organic thin-film transistors according to Example 1 and Comparative Example 1 were fabricated by the process described above. Thirty elements were fabricated in each example, and the number of elements having short circuit failure between the gate electrode and the capacitor electrode was determined.

As a result, no substantial difference was found in capacitance of the capacitor. On the other hand, the number of elements having short circuit failure was 13 in the element according to Comparative Example 1, while it was 0 in the element according to Example 1, showing a substantial decrease.

As described above, a plurality of insulating layers were formed on the capacitor electrode 3, and the gate electrode was formed in the lower layer, which is a different layer from the layer in which the capacitor electrode was formed. Accordingly, the yield was improved, and the freedom in modification of size of the capacitor electrode was also improved.

Therefore, it is possible to provide an organic thin-film transistor fabricated by a printing method with high yield and a capacitor electrode that is as large as possible, and an image display device using the same.

Example 2-1

In Example 2-1, the organic thin-film transistor 130 shown in FIG. 5 was fabricated.

An alkali-free glass of 0.7 mm thickness was used as a material for the substrate 1. Silver nano ink, which is a dispersion solution of silver nanoparticles, was applied to the substrate 1 in a desired pattern by using an ink jet method, followed by baking at 150° C. for one hour to thereby form the gate electrode 2. A space between the gate electrode and the capacitor electrode was 5 μm at a minimum distance.

On the substrate 1 on which the gate electrode 2 was formed, a photosensitive acryl resin was applied by a slit coating method. Then, light exposure and development were performed to pattern a desired shape, followed by baking at 200° C. to thereby form the first insulating layer 41.

On the substrate 1 on which the first insulating layer 41 was formed, silver nano ink was applied in a desired pattern by using an ink jet method, followed by baking at 150° C. for one hour to thereby form the capacitor electrode 3. The capacitor electrode 3 had an area of 75% relative to the area of the element.

Then, the second insulating layer 42 was formed in the same manner as that of the first insulating layer 41. The film thickness of the first insulating layer 41 was 0.6 μm, and the relative dielectric constant was 3.4. The film thickness of the second insulating layer 42 was 0.4 μm, and the relative dielectric constant was 3.4.

A dispersion solution of silver nano articles was applied as ink in a desired pattern by using an ink jet method, followed by baking at 150° C. for one hour to thereby form the source electrode 5 and the drain electrode 6.

Then, a mesitylene solution in which poly(3-hexylthiophene) was dissolved at a concentration of 0.1 wt. % was patterned as an organic semiconductor material by an ink jet method to thereby form the semiconductor layer 7.

Example 2-2

In Example 2-2, the organic thin-film transistor 140 shown in FIG. 6 was fabricated.

The organic thin-film transistor 140 was fabricated in the same manner as Example 2-1, except that the second insulating layer 42 was made of a material having the relative dielectric constant of 4.6 and formed to cover only the capacitor electrode 3, and the film thickness of the first insulating layer 41 was 1.0 μm.

Comparative Example 2

In Comparative Example 2, the organic thin-film transistor 210 shown in FIG. 8 was fabricated.

An alkali-free glass of 0.7 mm thickness was used as a material for the substrate 1. On the substrate 1, a Mo film was formed at 400 nm thickness by using DC magnetron sputtering, and patterned in a desired shape by photolithography to thereby form the gate electrode 2 and the capacitor electrode 3. A space between the gate electrode and the capacitor electrode was 20 μm at a minimum distance. The capacitor electrode 3 had an area of 65% relative to the area of the element.

On the substrate 1 on which the gate electrode 2 and the capacitor electrode 3 were formed, a photosensitive acryl resin was applied by a slit coating method, and patterned by photolithography, followed by baking at 200° C. to thereby form the first insulating layer 41. The film thickness of the first insulating layer 41 was 1.0 μm, and the relative dielectric constant was 3.4.

Subsequently, ink in which silver nanoparticles were dispersed was applied in a desired pattern by using an ink jet method, followed by baking at 150° C. for one hour to thereby form the source electrode 5 and the drain electrode 6.

Then, a mesitylene solution in which poly(3-hexylthiophene) was dissolved at a concentration of 0.1 wt. % was patterned as an organic semiconductor material by an ink jet method to thereby form the semiconductor layer 7.

Thus, the organic thin-film transistors according to Example 2-1 and 2-2 and Comparative Example 2 were fabricated by the process described above. For each example, 30 elements were fabricated, and the number of elements having short circuit failure between the gate electrode and the capacitor electrode, on-current value as transistor characteristics, and electrostatic capacitance of the capacitor were determined.

For the on-current value, no substantial difference was found among Examples 2-1, 2-2, and Comparative Example 2. Other results are shown in Table 1. For the electrostatic capacitance of the capacitor, a relative value was shown with the result of the element of Comparative Example 2 taken as 100 percent.

TABLE 1

| | Electrostatic capacitance of capacitor | Number of elements having short circuit failure |
| --- | --- | --- |
| Example 2-1 | 115% | 0 |
| Example 2-2 | 150% | 0 |
| Comparative Example 2 | 100% | 13 |

As described above, the capacitor electrode was formed in a separate layer from the gate electrode and in an upper layer thereof. Accordingly, the capacitor capacitance was improved and the yield was also improved.

Therefore, it is possible to provide an organic thin-film transistor fabricated by a printing method with high yield and high capacitor capacitance, and an image display device using the same.

Example 34

In Example 3-1, the organic thin-film transistor 160 shown in FIG. 9 was fabricated.

An alkali-free glass of 0.7 mm thickness was used as the substrate 1. A dispersion solution of silver (Ag) nanoparticles was applied as ink on the substrate 1 in a desired pattern by using an ink jet method, followed by baking at 150° C. for one hour to thereby form the first capacitor electrode 31.

On the substrate on which the first capacitor electrode 31 was formed, a heat-curable resin was applied, followed by baking to thereby form the first insulating layer 41.

Then, the source electrode 5 and the drain electrode 6 were formed by an ink jet method in the same manner as the first capacitor electrode 31.

Then, on the substrate on which the source electrode 5 and the drain electrode 6 were formed, a mesitylene solution in which poly(3-hexylthiophene) was dissolved at a concentration of 0.1 wt. % was patterned as an organic semiconductor material by an ink jet method to thereby form the semiconductor layer 7.

Then, a fluororesin was applied by an ink jet method to thereby form the second insulating layer 42.

Subsequently, a solution in which silver nanoparticles were dispersed was applied as ink in a desired pattern by using an ink jet method, followed by baking at 150° C. for one hour to thereby form the gate electrode 2. Thus, the organic thin-film transistor 160 was fabricated.

Example 3-2

In Example 3-4, the organic thin-film transistor 170 shown in FIG. 10 was fabricated.

An alkali-free glass of 0.7 mm thickness was used as the substrate 1. A dispersion solution of silver (Ag) nanoparticles was applied as ink on the substrate 1 in a desired pattern by using an ink jet method, followed by baking, at 150° C. for one hour to thereby form the first capacitor electrode 31.

On the substrate on which the first capacitor electrode 31 was formed, a heat-curable resin was applied, followed by baking to thereby form the first insulating layer 41.

Then, the source electrode 5 and the drain electrode 6 were formed by an ink jet method in the same manner as the first capacitor electrode 31.

Then, on the substrate on which the source electrode 5 and the drain electrode 6 were formed, a mesitylene solution in which poly(3-hexylthiophene) was dissolved at a concentration of 0.1 wt. % was patterned as an organic semiconductor material by an ink jet method to thereby form the semiconductor layer 7.

Then, a fluororesin was applied by an ink jet method to thereby form the second insulating layer 42.

Subsequently, ink in which silver nanoparticles were dispersed was applied in a desired pattern by using an ink jet method, followed by baking at 150° C. for one hour to thereby form the gate electrode 2 and the second capacitor electrode 32. Thus, the organic thin-film transistor 170 was fabricated.

Comparative Example 3

Figure 11:
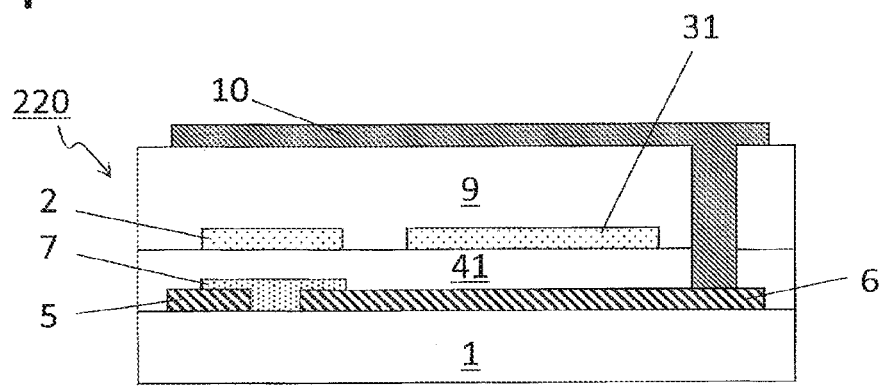
FIG. 11 is schematic cross-sectional view of an organic thin-film transistor according to a comparative example.

In Comparative Example 3, the organic thin-film transistor 220 shown in FIG. 11 was fabricated.

An alkali-free glass of 0.7 mm thickness was used as the substrate 1. A solution in which silver (Ag) nanoparticles were dispersed was applied as ink to the substrate 1 in a desired pattern by using an ink jet method, followed by baking at 150° C. for one hour to thereby form the source electrode 5 and the drain electrode 6.

Then, on the substrate on which the source electrode 5 and the drain electrode 6 were formed, a mesitylene solution in which poly(3-hexylthiophene) was dissolved at a concentration of 0.1 wt. % was patterned as an organic semiconductor material by an ink jet method to thereby form the semiconductor layer 7.

Then, a fluororesin was applied by an ink jet method to thereby form the first insulating layer 41 (gate insulating layer).

Subsequently, ink in which silver nanoparticles were dispersed was applied in a desired pattern by using an ink jet method, followed by baking at 150° C. for one hour to thereby form the gate electrode 2 and the capacitor electrode 31. Thus, the organic thin-film transistor 220 according to the comparative example was fabricated.

Thus, the organic thin-film transistors according to Example 3-1 and 3-2 and Comparative Example 3 were fabricated by the process described above. In Example 3-1, the first capacitor electrode 31 was disposed in the first insulating layer 41, located under the drain electrode 6, which is a layer different from the second instituting layer 42 on which the gate electrode 2 was formed. Accordingly, in the organic thin-film transistor 160 of a top-gate structure, the transistor section size was designed with a margin while ensuring a sufficient capacitor electrode area, and thus the organic thin-film transistor 160 that can operate in a stable manner was formed.

Further, in Example 3-2, the second capacitor electrode 32 was further formed on the second insulating layer 42 on which the gate electrode 2 was formed. Thus, the capacitor capacitance of the organic thin-film transistor 170 was significantly increased compared with the organic thin-film transistor 220 of the comparative example.

In both examples, in the organic thin-film transistor of a top-gate structure, it was possible to provide the organic thin-film transistors 160 and 170 that enabled high yield by providing a margin in transistor size while maintaining good semiconductor characteristics, and that maintained high voltage holding ratio of the transistor pixel electrode to operate in a stable manner by having a large area for the capacitor electrode, and to provide the image display devices using the organic thin-film transistors 160 and 170.

As described above, in the organic thin-film transistors 160 and 170, the first capacitor electrode 31 was disposed in the first insulating layer 41, located under the drain electrode 6, which is a layer different from the second insulating layer 42 on which the gate electrode 2 was formed. By forming the first capacitor electrode 31 in a layer different from the layer on which the gate electrode 2 was formed, it was possible to design the sizes of the organic thin-film transistors 160 and 170 with a margin while ensuring a large area for the first capacitor electrode 31. As a result, in the organic thin-film transistors 160 and 170, by maintaining a large area of the first capacitor electrode 31, and forming the first insulating layer 41 in accordance with a desired electrostatic capacitance, a sufficient electrostatic capacitance can be obtained and the voltage holding ratio can be improved.

Accordingly, in the organic thin-film transistor of a top-gate structure, it is possible to provide organic thin-film transistors that enable high yield by providing a margin in transistor size while maintaining good semiconductor characteristics, and that can maintain a high voltage holding ratio of the transistor pixel electrode to operate in a stable manner by having a large area for the capacitor electrode, and to provide image display devices using the same.

The present application addresses the following. In production of organic thin-film transistors by a printing method, various printing methods are used in accordance with the characteristics of the respective layers of the thin-film transistor. However, film formation by wet coating has lower patterning precision compared with a conventional photolithography process, which often causes reduction in yield. Since reduction in yield leads to an increase in cost, it is difficult to achieve cost advantage, which was initially expected.

To avoid this situation, the respective layers of thin-film transistor can be designed with a margin in size. However, designing the size with a margin causes an increase in the area of the thin-film transistor section, which makes it difficult to fabricate a thin-film transistor pattern with high resolution. Further, an increase in the area of the thin-film transistor leads to limitation in an area of capacitor electrode that serves as an auxiliary capacitance for driving an active matrix image display device which uses a thin-film transistor. In particular, in a thin-film transistor of a top-gate structure, providing a gate electrode and a capacitor electrode in the same layer causes difficulty in ensuring a large area for the capacitor electrode, and thus a sufficient capacitance.

On the other hand, organic thin-film transistors often have disadvantages in characteristics compared with thin-film transistors fabricated by a dry coating method. To address the disadvantages in characteristics, a highly precise structure is required. For example, while the transistor electrodes and wirings need to be located on the entire surface of the substrate, the transistor electrodes preferably have a large patterning area and the wirings preferably have fine patterning.

In particular, the capacitor electrode needs to have a structure as large as possible. In active matrix image display devices, a capacitor in the thin-film transistor serves to assist in holding the voltage during writing to the respective pixels, and the voltage holding ratio for a selected time decreases if the capacitance is insufficient. Accordingly, measures need to be taken, such as increasing the write voltage or increasing the number of times of writing. As a result, in image display devices, the write-in time and the power consumption may increase.

As shown in FIG. 4, since a capacitor electrode and a gate electrode are typically formed in the same layer, a mere increase in area of capacitor electrode leads to an increase in occurrence of short circuits between the gate electrode and the capacitor electrode.

Short circuit may occur not only between the gate electrode and the capacitor electrode but also between the gate electrode and the source/drain electrode, or between the capacitor electrode and the drain electrode. For example, electric field concentration may occur due to irregularity on the electrode surface, leading to damage to the insulating film. This particularly occurs when a voltage difference between electrodes is large. In view of the voltage applied across the electrodes, the probability of occurrence is higher between the gate electrode and the source/drain electrode than between the capacitor electrode and the drain electrode.

Accordingly, an insulating layer that separates the gate electrode and the source/drain electrode needs to have a sufficient thickness to provide a voltage resistance. On the other hand, an insulating layer that separates the capacitor electrode and the drain electrode can be relatively reduced in thickness. Thus, there are differences in characteristic values, thicknesses, and the like required for the insulating layers between the gate electrode and the source/drain electrode and between the capacitor electrode and the drain electrode.

The present invention has an aspect to provide an organic thin-film transistor produced by a printing method with high yield and a sufficient capacitor electrode area, and an image display device using the same.

Further, another aspect of the present invention is to provide an organic thin-film transistor of a top-gate structure that enables high yield by providing a margin in transistor size while maintaining good semiconductor characteristics, and that can maintain a high voltage holding ratio of the transistor pixel electrode to operate in a stable manner by having a large area for the capacitor electrode, and a method for producing the same, and to provide an image display device.

According to an aspect of the present invention, an organic thin-film transistor includes: on an insulating substrate, at least a gate electrode; a capacitor electrode; an insulating layer formed to cover the gate electrode and the capacitor electrode; a source electrode and a drain electrode formed on the insulating layer; and a semiconductor layer containing an organic semiconductor material formed in a region between the source electrode and the drain electrode, wherein, a first insulating layer is formed to cover at least the capacitor electrode; the gate electrode is formed on the first insulating layer; a second insulating layer is formed to cover the gate electrode and the capacitor electrode; and at least the source electrode, the drain electrode, and the semiconductor layer are each formed on the second insulating layer.

According to another aspect of the present invention, an organic thin-film transistor includes: on an insulating substrate, at least a gate electrode; a capacitor electrode; an insulating layer formed to cover the gate electrode and the capacitor electrode; a source electrode and a drain electrode formed on the insulating layer; and a semiconductor layer containing an organic semiconductor material formed in a region between the source electrode and the drain electrode, wherein: a first insulating layer is formed to cover at least the capacitor electrode; the gate electrode is formed on the first insulating layer; a second insulating layer is formed to cover the gate electrode but not to cover the capacitor electrode; and at least the source electrode, the drain electrode, and the semiconductor layer are each formed on the second insulating layer.

Further, the first insulating layer and the second insulating layer may be made of different materials.

Further, a dielectric constant of the first insulating layer may be higher than a dielectric constant of the second insulating layer.

Further, the first insulating layer may be formed of two or more layers of insulating material.

Further, the second insulating layer may be formed of two or more layers of insulating material.

According to another aspect of the present invention, an organic thin-film transistor includes: an insulating substrate; a gate electrode; a capacitor electrode; an insulating layer; a source electrode; a drain electrode; and a semiconductor layer containing an organic semiconductor material, wherein the insulating layer includes: a first insulating layer formed to cover the substrate and the gate electrode formed on the substrate; and a second insulating layer formed to cover the capacitor electrode formed on the first insulating layer.

Further, the source electrode, the drain electrode, and the semiconductor layer may be formed on the second insulating layer.

Further, the source electrode, part of the drain electrode, and the semiconductor layer may be formed on the first insulating layer.

Further, the first insulating layer and the second insulating layer may be made of different materials.

Further, a dielectric constant of the second insulating layer may be higher than a dielectric constant of the first insulating layer.

Further, a film thickness of the second insulating layer may be smaller than film thickness of the first insulating layer.

Further, the first insulating layer may be formed of two or more layers of insulating material.

Further, the second insulating layer may be formed of two or more layers of insulating material.

According to another aspect of the present invention, an organic thin-film transistor includes: on an insulating substrate, at least a first capacitor electrode; a first insulating layer; a source electrode; a drain electrode; a semiconductor layer containing an organic semiconductor material; a second insulating layer; and a gate electrode, wherein: the first capacitor electrode is formed on the substrate; the first insulating layer is formed on at least the first capacitor electrode; the source electrode, the drain electrode, and the semiconductor layer are formed on the first insulating layer; the drain electrode overlaps with at least part of the first capacitor electrode in plan view; the second insulating layer is formed on the source electrode, at least part of the drain electrode, and the semiconductor layer; and the gate electrode is formed on the second insulating layer.

Further, a second capacitor electrode may be further formed on the second insulating layer, and the second capacitor electrode may overlap with at least part of the drain electrode in plan view.

Further, a relative dielectric constant of the first insulating layer may be larger than a relative dielectric constant of the second insulating layer.

Further, a film thickness of the first insulating layer may be smaller than a film thickness of the second insulating layer.

Further, a relative dielectric constant of the first insulating layer may be 3.0 or more.

According to another aspect of the present invention, a method for producing an organic thin-film transistor includes the steps of providing a first capacitor electrode on an insulating substrate; providing a first insulating layer on at least the first capacitor electrode; providing a source electrode and a drain electrode spaced from each other on the first insulating layer; providing a semiconductor layer containing an organic semiconductor material between the source electrode and the drain electrode; providing a second insulating layer on the semiconductor layer; and providing a gate electrode on the second insulating layer.

Further, the method may further include a step of providing a second capacitor electrode an the second insulating layer.

Further, another aspect of the present invention is an image display device using the above organic thin-film transistor.

According to embodiments of the present invention, it is possible to provide an organic thin-film transistor produced by a printing method with high yield without causing a short circuit failure especially between the gate electrode and the capacitor electrode, ensuring a sufficient capacitor electrode area, and an image display device.

Further, according to embodiments the present invention, in the organic thin-film transistor of a top-gate structure, it is possible to provide organic thin-film transistors that enable high yield by providing a margin in transistor size while maintaining good semiconductor characteristics and that can maintain high voltage holding ratio of the transistor pixel electrode to operate in a stable manner by having a large area for the capacitor electrode, and to provide image display devices using the same.

INDUSTRIAL APPLICABILITY

The embodiments of present invention can be favorably applied to image display devices and various sensors.

REFERENCE SIGNS LIST

1: Substrate
2: Gate electrode
3: Capacitor electrode
31: First capacitor electrode
32: Second capacitor electrode
4: Insulating layer
41: First insulating layer
42: Second insulating layer
5: Source electrode
6: Drain electrode
7: Semiconductor layer
8: Protective layer
9: Interlayer insulating film
10: Pixel electrode
100 to 170, 200 to 220: Organic thin-film transistor Obviously, numerous modifications and variations of the present invention are possible in light of the above teachings. It is therefore to be understood that within the scope of the appended claims, the invention may be practiced otherwise than as specifically described herein.

What is claimed is:

1. An organic thin-film transistor, comprising:
    an insulating substrate;
    a capacitor electrode formed on the insulating substrate;
    a first insulating layer formed on the insulating substrate such that the first insulating layer is embedding the capacitor electrode therein;
    a gate electrode formed on a surface of the first insulating layer;
    a second insulating layer formed on the surface of the first insulating layer such that the second insulating layer is embedding the gate electrode therein and is not covering the capacitor electrode;
    a source electrode formed on a surface of the second insulating layer such that the second insulating layer is interposed between the gate electrode on the surface of the first insulating layer and the source electrode on the surface of the second insulating layer;
    a drain electrode formed on the surface of the first insulating layer and the surface of the second insulating layer such that the drain electrode is extending and formed on a side surface of the second insulating layer between the surface of the first insulating layer and the surface of the second insulating layer; and
    a semiconductor layer formed on the surface of the second insulating layer in a portion formed between the source electrode and the drain electrode and comprising an organic semiconductor material.

2. The organic thin-film transistor of claim 1, wherein the first insulating layer and the second insulating layer comprise different materials.

3. The organic thin-film transistor of claim 1, wherein the first insulating layer has a dielectric constant which is higher than a dielectric constant of the second insulating layer.

4. The organic thin-film transistor of claim 1, wherein the first insulating layer includes a plurality of layers comprising insulating material.

5. The organic thin-film transistor of claim 1, wherein the second insulating layer includes a plurality of layers comprising insulating material.

6. The organic thin-film transistor of claim 1, further comprising:
    an interlayer insulating film formed on the first insulating layer and the second insulating layer such that the interlayer insulating film is covering the source electrode, the drain electrode and the semiconductor layer; and
    a pixel electrode formed on the interlayer insulating film such that the pixel electrode is penetrating through the interlayer insulating film and connected to a portion of the drain electrode on the first insulating layer.

7. The organic thin-film transistor of claim 1, further comprising:
    a protective layer formed on the semiconductor layer such that the protective layer is covering the semiconductor layer.

8. The organic thin-film transistor of claim 1, further comprising:
a protective layer formed on the semiconductor layer such that the protective layer is covering the semiconductor layer;
an interlayer insulating film formed on the first insulating layer and the second insulating layer such that the interlayer insulating film is covering the source electrode, the drain electrode and the protective layer; and
a pixel electrode formed on the interlayer insulating film such that the pixel electrode is penetrating through the interlayer insulating film and connected to a portion of the drain electrode on the first insulating layer wherein the first insulating layer includes a plurality of layers comprising insulating material.

9. The organic thin-film transistor of claim 1, further comprising:
an interlayer insulating film formed on the first insulating layer and the second insulating layer such that the interlayer insulating film is covering the source electrode, the drain electrode and the semiconductor layer.

10. The organic thin-film transistor of claim 6, wherein the first insulating layer and the second insulating layer comprise different materials.

11. The organic thin-film transistor of claim 6, wherein the first insulating layer has a dielectric constant which is higher than a dielectric constant of the second insulating layer.

12. The organic thin-film transistor of claim 6, wherein the first insulating layer includes a plurality of layers comprising insulating material.

13. The organic thin-film transistor of claim 6, wherein the second insulating layer includes a plurality of layers comprising insulating material.

14. The organic thin-film transistor of claim 7, wherein the first insulating layer and the second insulating layer comprise different materials.

15. The organic thin-film transistor of claim 7, wherein the first insulating layer has a dielectric constant which is higher than a dielectric constant of the second insulating layer.

16. The organic thin-film transistor of claim 7, wherein the first insulating layer includes a plurality of layers comprising insulating material.

17. The organic thin-film transistor of claim 7, wherein the second insulating layer includes a plurality of layers comprising insulating material.

18. The organic thin-film transistor of claim 8, wherein the first insulating layer and the second insulating layer comprise different materials.

19. The organic thin-film transistor of claim 8, wherein the first insulating layer has a dielectric constant which is higher than a dielectric constant of the second insulating layer.

20. The organic thin-film transistor of claim 8, wherein the first insulating layer includes a plurality of layers comprising insulating material.

21. The organic thin-film transistor of claim 8, wherein the second insulating layer includes a plurality of layers comprising insulating material.

22. The organic thin-film transistor of claim 9, wherein the first insulating layer and the second insulating layer comprise different materials.

23. The organic thin-film transistor of claim 9, wherein the first insulating layer has a dielectric constant which is higher than a dielectric constant of the second insulating layer.

24. The organic thin-film transistor of claim 9, wherein the first insulating layer includes a plurality of layers comprising insulating material.

25. The thin-film transistor of claim 1, wherein the first insulating layer has a film thickness which is smaller than a film thickness of the second insulating layer.

26. The thin-film transistor of claim 1, wherein the first insulating layer has a relative dielectric constant of 3.0 or more.

* * * * *